(12) United States Patent
Knight et al.

(10) Patent No.: US 11,894,842 B2
(45) Date of Patent: *Feb. 6, 2024

(54) CIRCUIT AND DEVICE INCLUDING A TRANSISTOR AND DIODE

(71) Applicant: Search For The Next, LTD., Nottingham (GB)

(72) Inventors: Luke Knight, Nottingham (GB); Roger Light, Nottingham (GB); David Summerland, Nottingham (GB)

(73) Assignee: Search For The Next LTD, Nottingham (GB)

( * ) Notice: Subject to any disclaimer, the term of this patent is extended or adjusted under 35 U.S.C. 154(b) by 38 days.

This patent is subject to a terminal disclaimer.

(21) Appl. No.: 17/634,655

(22) PCT Filed: Aug. 12, 2020

(86) PCT No.: PCT/GB2020/000069
§ 371 (c)(1),
(2) Date: Feb. 11, 2022

(87) PCT Pub. No.: WO2021/028648
PCT Pub. Date: Feb. 18, 2021

(65) Prior Publication Data
US 2022/0286133 A1    Sep. 8, 2022

(30) Foreign Application Priority Data

Aug. 12, 2019 (GB) ...................................... 1911540
Aug. 20, 2019 (GB) ...................................... 1911961
Dec. 2, 2019 (GB) ...................................... 1917561

(51) Int. Cl.
*H03K 19/003* (2006.01)
*H03K 19/20* (2006.01)

(52) U.S. Cl.
CPC ....... *H03K 19/00315* (2013.01); *H03K 19/20* (2013.01)

(58) Field of Classification Search
None
See application file for complete search history.

(56) References Cited

U.S. PATENT DOCUMENTS

2009/0027564 A1* 1/2009 Park ................... H04N 21/4113
710/1
2013/0093465 A1* 4/2013 McGinn ............... H03K 19/082
326/82

(Continued)

FOREIGN PATENT DOCUMENTS

EP    85308066.1    5/1986

OTHER PUBLICATIONS

Tony R. Kuphaldt, "Lessons in Electric Circuits", vol. IV—Digital, Fourth Edition, Nov. 1, 2007.

*Primary Examiner* — Jany Richardson
(74) *Attorney, Agent, or Firm* — Fleit Intellectual Property Law; Jose Gutman

(57) ABSTRACT

A circuit including: a transistor, a base of the transistor being switchably connectable to a signal source; and a first diode connected between the base and a reference voltage. The circuit is arranged such that when the signal source is not connected to the base of the transistor, a voltage applied at an emitter of the transistor causes a current flow through the base of the transistor and through the first diode such that the transistor is in an ON state, and when the signal source is connected to the base of the transistor, current flow through the base reduces such that the transistor switches to an OFF state. The circuit includes a second diode, and the signal source is connectable to the base of the transistor through the second diode.

20 Claims, 18 Drawing Sheets

(56) References Cited

U.S. PATENT DOCUMENTS

2021/0211125 A1\* 7/2021 Summerland ....... H01L 27/0783
2021/0343582 A1\* 11/2021 Summerland ......... H01L 27/067

\* cited by examiner

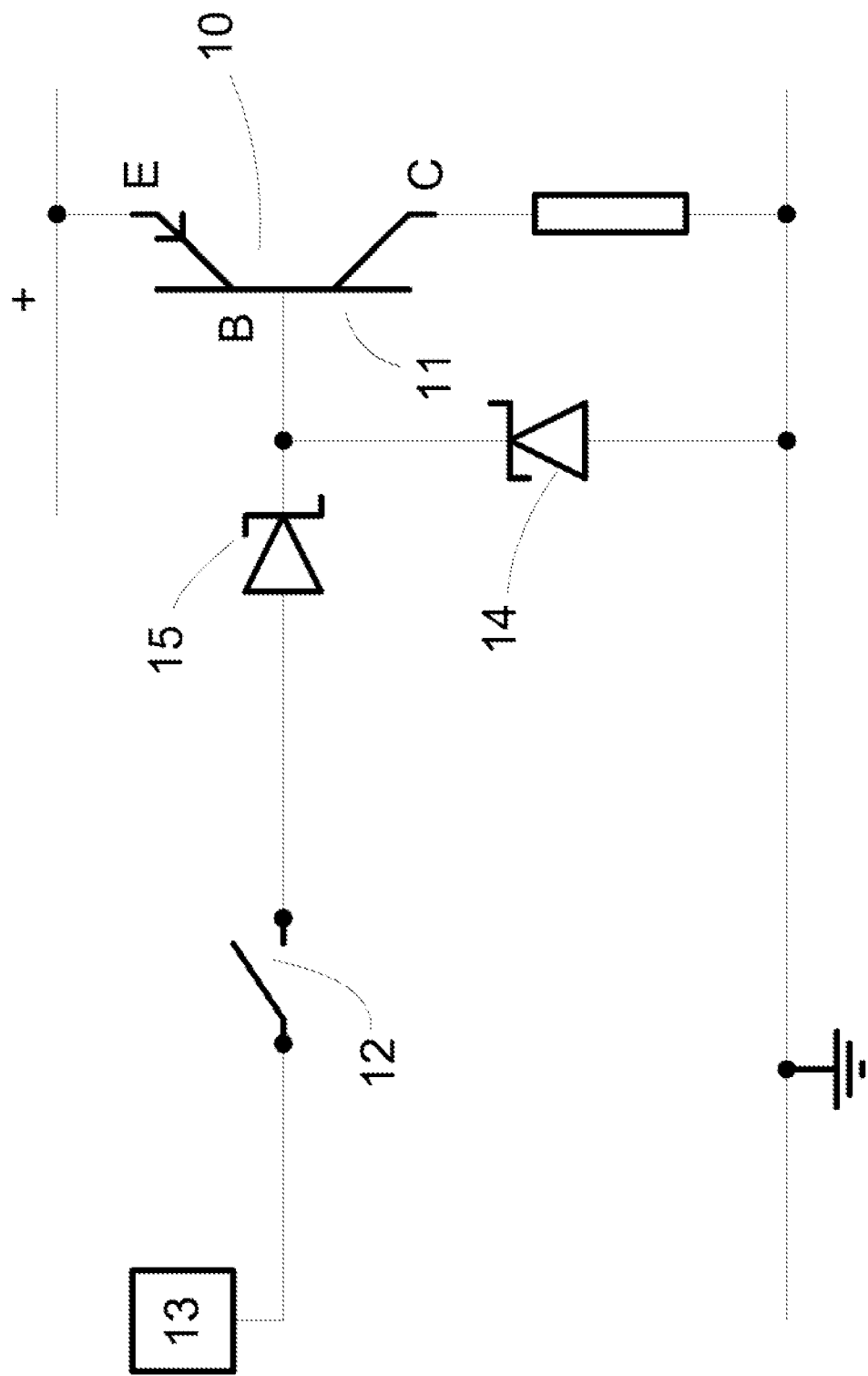

CIRCUIT AND DEVICE INCLUDING A TRANSISTOR AND DIODE

CROSS-REFERENCE TO RELATED APPLICATIONS

This application claims priority from and is related to the following prior application Patent Cooperation Treaty Patent PCT/GB2020/000069, filed on Aug. 12, 2020, which claims priority from Great Britain Patent Application No. 1911540.1, filed on Aug. 12, 2019, and from Great Britain Patent Application No. 1911961.9, filed Aug. 20, 2019, and from Great Britain Patent Application No. 1917561.1, filed Dec. 2, 2019. These prior applications, including the entirety of their written description and drawings, are collectively hereby incorporated by reference into the present application.

BACKGROUND

The present application generally relates to transistor and diode devices and more specifically to a circuit, such as an integrated circuit, including the transistor and diode devices, and to a method of operating the circuit.

The use of a 'normally on' transistor, namely where the transistor functions in an ON state in the absence of a signal applied to the base, is desirous for the formation of digital logic circuits as they allow for the construction of logic gates without need for complementary transistors, halving the transistor count.

It is known that a PNP bipolar junction transistor (BJT) can be operated as a normally on transistor through a circuit configuration in which the base of the BJT is connected to ground through a resistor. When a voltage is applied across the emitter and base terminals of the BJT, the emitter being more positive, a current can flow out of the base terminal and through the resistor. This allows for current flow between the emitter and collector terminals of the transistor; in other words the transistor is ON. To turn OFF the transistor the base of the transistor is connected to a current source able to provide sufficient current through the resistor that the current out of the base drops sufficiently (or stops) such that current flow between the emitter and collector ceases.

The temperature coefficient of resistors is typically large. This makes it difficult to provide the aforementioned circuit with operational stability over a wide range of temperatures. Further, the resistance value (ohms) of the resistor must be large to be sufficiently current limiting that the transistor can be switched OFF with the maximum current available from the current source. Resistors with values that meet this requirement are physically relatively large. For these reasons it is impracticable to use this circuit design in many integrated circuits (IC).

BRIEF SUMMARY

According to a first aspect of the invention there is provided a circuit comprising: a transistor, a signal source; a base of the transistor being switchably connectable to the signal source; a first diode connected between the base of the transistor, and a reference voltage; the circuit arranged such that when the signal source is not connected to the base of the transistor, a voltage applied at an emitter of the bipolar transistor causes a current flow through the base of the transistor and through the first diode such that the transistor is in an ON state; the impedance of the signal source is lower than the impedance of the transistor through the emitter and base; the first diode provides a current limiting function such that when the signal source is connected to the base of the transistor, current flow through the base reduces such that the transistor switches to an OFF state; the circuit comprising a second diode, the second diode having a diode junction provide by contact between a semiconductor region that provides the base of the transistor and a further semiconductor region in direct contact with the semiconductor region that provides the base of the transistor; and in which the signal source is connected to the base through the second diode.

The first diode provides the current limiting function of a large resistor of the prior art circuit; however, the first diode, unlike a resistor, is a relatively small electronic component and therefore makes the circuit more feasible for use in implementing digital logic circuits.

The current limiting function of the first diode provides a convenient means to restrict current flow through the base-emitter terminals of the transistor when ON to allow for a relatively small potential drop across the emitter base of the transistor. This leads to a small change in the voltage of the base transistor (relative to reference voltage) when the transistor switches between OFF and ON which reduces the likelihood of the formation of parasitic effects between bases of neighboring transistor formed within a semiconductor device.

The first diode may provide the current limiting function in one or more ways. For example it may be selected to be of a physical size that provides the required resistance; the smaller the diode the more limited its current carrying capacity. Alternatively or additionally the first diode may be arranged in the circuit to be reversed biased when the voltage is applied across and emitter terminal of the transistor and the second terminal of the diode. This latter method is preferred, especially where larger diodes are to be used.

The circuit may be operated such that the first diode is reversed biased with a voltage across the first diode that is below its breakdown voltage. When reversed biased, current flow through the diode may be a result of a leakage current due to quantum tunneling.

The first diode may be a Zener diode. Compared with many other types of diode, Zener diodes, when biased below their Zener voltage (breakdown voltage), operate reliably compared with other diodes. Nevertheless, alternative diodes may be used such as, for example, a tunnel diode which may be operated in forward bias.

Favorably the modulus of the temperature coefficient of the first diode is less or equal to 2 mV per degree Celsius. More favorably the first diode has a temperature coefficient of approximately 0 mV per degree Celsius as this provides provide the greatest degree of operational stability with changes in temperature.

To provide this temperature coefficient it is preferred that the first diode is a Zener diode selected to exhibit a Zener voltage less than or equal to about 5.6 V and more favorably about 5.6 V.

The bipolar junction transistor may be of PNP or NPN form. With PNP form the voltage across the emitter and second terminal of the first diode is arranged such that conventional current flows from the emitter, through the transistor out of the base and into the first diode, and that the signal source is a current source. With the NPN form the voltage across the emitter and second terminal of the diode is arranged such that conventional current flows from the second terminal of the first diode, through the first diode, into the base and out through the emitter, and that the signal source is a current sink.

The second diode may be a Zener diode. So long as the semiconductor regions that provide the second diode are sufficiently highly doped, the voltage drop across the second diode can be made small enough that, when in operation, the voltage drop across it is lower than the voltage drop across the emitter and base of the transistor, and favorably additionally does not have a significantly deleterious effect on the operation of the transistor. Where so the presence of the second diode can provide a number of benefits including those described below.

The second diode provides a non-metallic connection to the base of the transistor. This allows conductive traces to the base of the transistor to be comprised from polysilicon rather than metal. As polysilicon can also be used to connect the collector and emitter of the transistors, this avoids the need to provide a metal layer to provide any contacts to the transistor in turn reducing the number of steps required to manufacture the device. Additionally, because metal layers are typically thicker than polysilicon when used in the construction of power devices, and thus require larger track sizes and separation distances, it allows for an increased density of transistors for a given area.

As there will be a voltage drop across the second diode, the presence of the second diode prevents the base of the transistor being pulled up/down to the voltage of the signal source, e.g. power rail. The base region of the transistor has a capacitance, and so the presence of the second diode reduces the charge stored in base region thus reducing the power required to switch the transistor states (or reducing the time taken to switch for the same power.

The second diode can inhibit unwanted back propagation of signals from the base of the transistor back towards the signal source. This is beneficial where the transistor is one of many devices driven from a single signal source The sizes of the first and second diodes can be selected to change their equivalent resistance. This allows creation of circuits with a weak pull down (first diode) and low resistance input (second diode), which can be useful in analogue circuits to introduce offsets and bias to amplifiers.

The circuit finds particular utility in the implementation of a logic gate, for example as an inverter logic gate that outputs a voltage representing the opposite logic level to an input connected to the base of the transistor. Multiple of the aforementioned circuits as variously described above, may be connected together in order to implement logic gates that perform other logical operations.

The circuit may include one or more further diodes, each of the one or more further diodes comprised from the semiconductor region that provides the base of the transistor and one or more further semiconductor regions in direct contact with the semiconductor region that provides the base of the transistor; and in which one or more further signal sources are connectable to the base of the transistor through the one or more further diodes.

This allows the transistor to be switched off by connecting any one of the current sources to the base of the transistor and thus allows the circuit to implement a NOR logic gate circuit. This circuit advantageously allows a NOR gate to be implemented with a single transistor, whereas prior art implementations of NOR gates circuit, for example those implemented using CMOS fabrication processes, require multiple transistors.

Further advantageously, because each of the one or further semiconductor regions are in direct contact with the base of the transistor, they can be included without significantly increasing the overall size of transistor.

According to another aspect of the invention there is provided a semiconductor device comprising: a transistor comprised from: a first and second regions of a first type of semiconductor material that provide collector and emitter regions of the transistor, and a first region of a second type that provides a base of the transistor, between and in contact with each of the first and second regions of the first type; a first diode comprised from: the first region of the second type; and a third region of the first type of semiconductor in contact with the first region of the second type to form a first diode junction; and a second diode comprised from: the first region of the second type; and a fourth region of the first type of semiconductor in contact with the first region of the second type to form a second diode junction; and wherein the first, second, third and fourth regions of the first type of semiconductor material are provided by a semiconductor layer deposited onto a semiconductor wafer that defines, at least in part, the first region of a second type that provides the base region of the transistor.

This structure provides a convenient means of forming the circuit described above as the semiconductor region that provides the base of the transistor also provides one of the regions that provide the diode's PN junction.

The first diode may be comprised from a portion of the first region of the second type that is relatively highly doped compared with the remainder of the first region of the second type.

The portion of the first region of the second type that is relatively highly doped and the further region of the first type of semiconductor may provide a Zener diode.

The transistor may be a lateral bipolar junction transistor, the first and second regions of the first type being laterally spaced apart from one another about the first region of the second type and lie on the same side as the first region of the second type.

The semiconductor device may comprise an electrical terminal connected to the further region of the first type of semiconductor that provides a terminal of the first diode.

The further region of the first type of semiconductor may be provided, at least in part, by a semiconductor layer that has been deposited onto a semiconductor wafer which defines, at least in part, the first region of a second type that provides a base of the transistor. This provides a convenient means of providing these regions without the need for counter-doping the base, though counter-doping albeit less preferably could be used instead.

The first and second regions of a first type of semiconductor material may be provided by a semiconductor layer deposited onto a semiconductor wafer which defines, at least in part, the first region of a second type that provides a base region of the transistor. Again this provides advantages of counter-doping the silicon wafer.

The semiconductor device may comprise a contact terminal for the first diode that is in direct contact with the further region of the first type of semiconductor.

The further region of the first type of semiconductor may comprise a first portion that is relatively highly doped which together with the first region of the second type provides the first diode; and a second portion which is relatively lightly doped relative the first portion and provides a substrate layer.

The semiconductor device may comprises multiple second diodes comprise from: the first region of the second type; and multiple fourth regions of the first type of semiconductor, each in contact with the first region of the second type to form multiple second diode junctions; and wherein the multiple fourth regions of the first type of semiconductor material are provided by the semiconductor layer deposited onto a semiconductor wafer that defines, at least in part, the first region of a second type that provides the base region of the transistor.

The semiconductor layer deposited onto a semiconductor wafer may be comprised from poly-silicon.

The semiconductor device may comprise multiple first regions of the second type within the substrate layer and isolated from one another by the substrate layer. In this way multiple transistor-diode devices may be formed on a single wafer.

BRIEF DESCRIPTION OF THE DRAWINGS

The accompanying figures in which like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 1A is a schematic of a circuit comprising a PNP bipolar junction transistor and a reversed biased Zener diode, which implements an inverter logic gate (NOT gate);

DETAILED DESCRIPTION

Figure 1B:
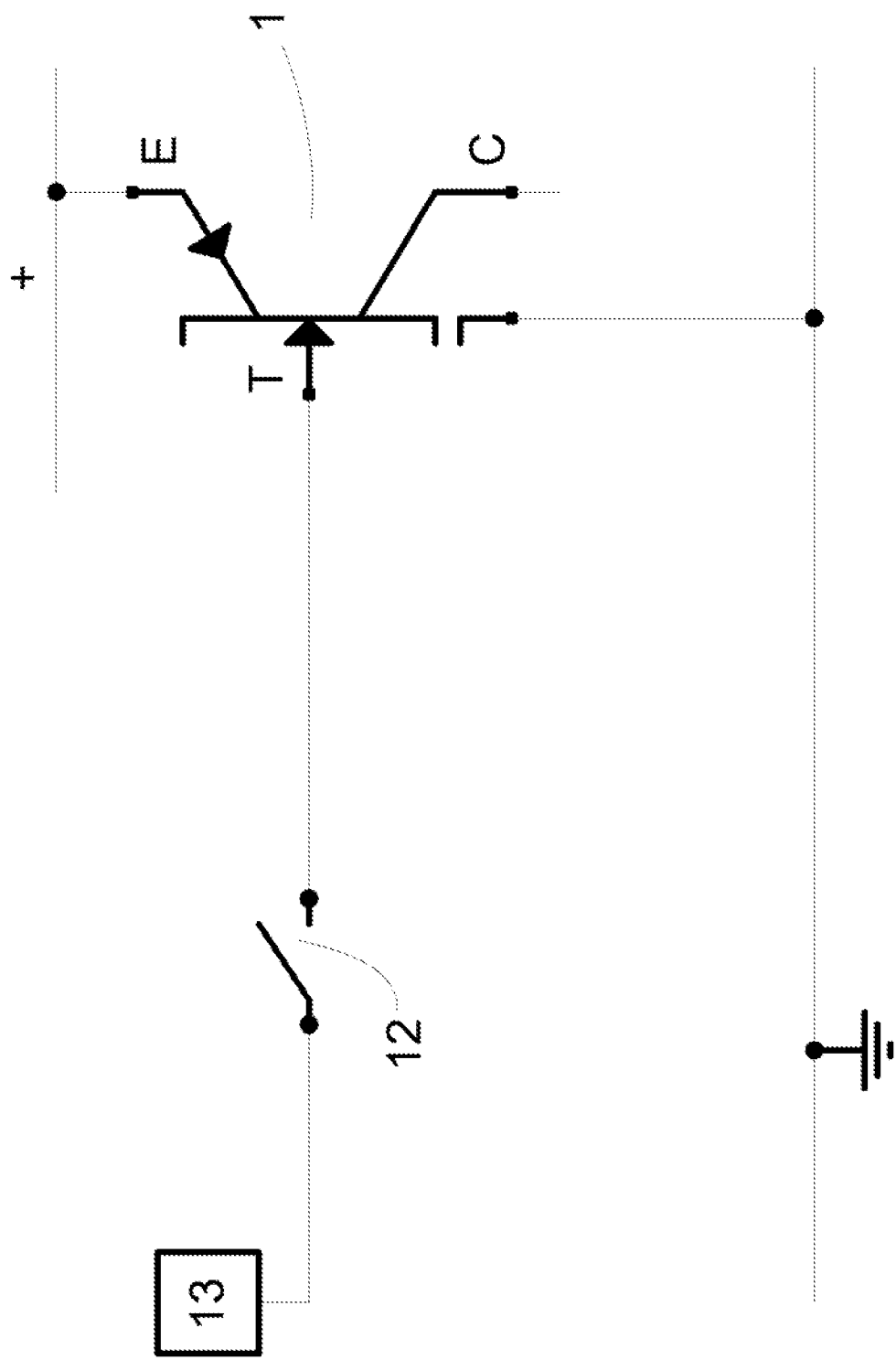
FIG. 1B is an alternative representation of the circuit of FIG. 1A using a single symbol to represent the electronic component implemented by the specific arrangement of transistors and Zener diodes.

As required, detailed embodiments are disclosed herein; however, it is to be understood that the disclosed embodiments are merely examples and that the devices and methods described herein can be embodied in various forms. Therefore, specific structural and functional details disclosed herein are not to be interpreted as limiting, but merely as a basis for the claims and as a representative basis for teaching one of ordinary skill in the art to variously employ the disclosed subject matter in virtually any appropriately detailed structure and function. Further, the terms and phrases used herein are not intended to be limiting, but rather, to provide an understandable description. Additionally, unless otherwise specifically expressed or clearly understood from the context of use, a term as used herein describes the singular and/or the plural of that term.

The terms "a" or "an", as used herein, are defined as one or more than one. The term "plurality", as used herein, is defined as two or more than two. The term "another", as used herein, is defined as at least a second or more. The terms "including" and "having," as used herein, are defined as comprising i.e., open language. The term "coupled," as used herein, is defined as "connected," although not necessarily directly, and not necessarily mechanically.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

With reference to FIG. 1A there is shown a circuit 10 comprising a PNP bipolar junction transistor 11. The emitter E of the transistor is connected to a high side rail and the collector of the transistor C connected to ground or some other low side reference voltage. The base B of the transistor 11 is switchably connectable through switch 12 to a current source 13.

A first terminal of a first Zener diode 14 is connected to both the base B of the transistor 11 and the current source 13 through switch 12. A second terminal of the first diode 14 is connected to ground or other low side reference voltage. The first Zener diode 14 is oriented such as to be reversed biased. The first Zener diode 14 is chosen with a Zener voltage of about 5.6 V in order that it has a temperature coefficient as close as possible to 0 mV per degree Celsius. This ensures the first Zener diode's 14 characteristics remain stable with any change in the diode's 14 temperature, e.g. as a result of external conditions.

With switch 12 open, such that the current source 13 is isolated from the base terminal B, there is a voltage drop across the transistor 11 and diode 14, and hence conventional current flow through the emitter base terminals of the transistor 11 and through the reversed biased diode 14; current flow through the diode 14 is attributable to a leakage current.

The circuit 10 is arranged such that the voltage drop across the diode 14 is below the breakdown voltage of the diode 14. The leakage current thus thought to be a consequence of quantum tunneling effects within the diode 14.

The diode 14 is selected such that, for the expected voltage drop across it, sufficient leakage current flows through it and therefore also between the emitter E and base B of the diode to allow for current flow between the emitter E and collector C of the transistor 11; i.e. the transistor is ON.

Additionally, it is preferable that the diode 14 is selected that, for the expected voltage across it, the leakage current flow is kept as low as possible whilst ensuring the transistor is ON. This has the advantage of reducing the voltage drop across the transistor when the transistor is ON and therefore reduces the change in potential of the base of the transistor (relatively to ground of some reference voltage) when the transistor is switched between OFF and ON. This minimizes static fields between transistors formed in the same wafer. In one example it is preferred that the switching voltage across the transistor is limited to around 0.5 V.

When the switch 12 is closed the current source is connected to the base B of the transistor 11 through a second, forward biased, Zener diode 15. The second Zener diode 15 is selected to have a forward voltage (i.e. through high doping of the junction) that is lower than the voltage drop across the emitter base of transistor 11 when the transistor is in the OFF state.

The impedance of the current source is selected to be lower than the impedance through the emitter base terminals of the transistor 11 causing the diode 14 to preferentially draw current from the current source 13, through the second Zener diode 15, rather than through the transistor 11. This results in current through the emitter-base of the transistor 11 reducing, e.g. substantially to zero, such that current between the emitter and collector reduces, if not ceases, to an extent that the transistor is considered OFF.

In order to ensure that current through the transistor 11 reduces when the switch 12 is closed, the diode 14 needs to be current limiting, i.e. it does not have the capacity to carry the maximum current that can be supplied by the current source 13 as well as the current from the transistor 11.

In the afore described circuit arrangement the transistor 11 can be treated as operating as a normally on transistor as the transistor is ON when there is no signal applied to the base.

The circuit of FIG. 1 can be used to implement an inverter (NOT) logic gate. When the base is connected to a signal source (input ON), i.e. the current source 13, current flow at the collector side of the transistor 11 will be substantially zero (output OFF). In contrast when the base is disconnected from the signal source (input OFF) there will be current through the collector (output ON).

Both the first and second Zener diodes 14, 15 can be integrated with the transistor 11, as will be described in relation to FIG. 3 below, to provide an integrated transistor-Zener electronic device. FIG. 1B shows an alternative representation of the circuit of FIG. 1A in which the transistor 11 and diodes 14 and 15 are illustrated using a single electronic circuit symbol. T represents the connection to the base of the transistor through diode 15.

Figure 2A:
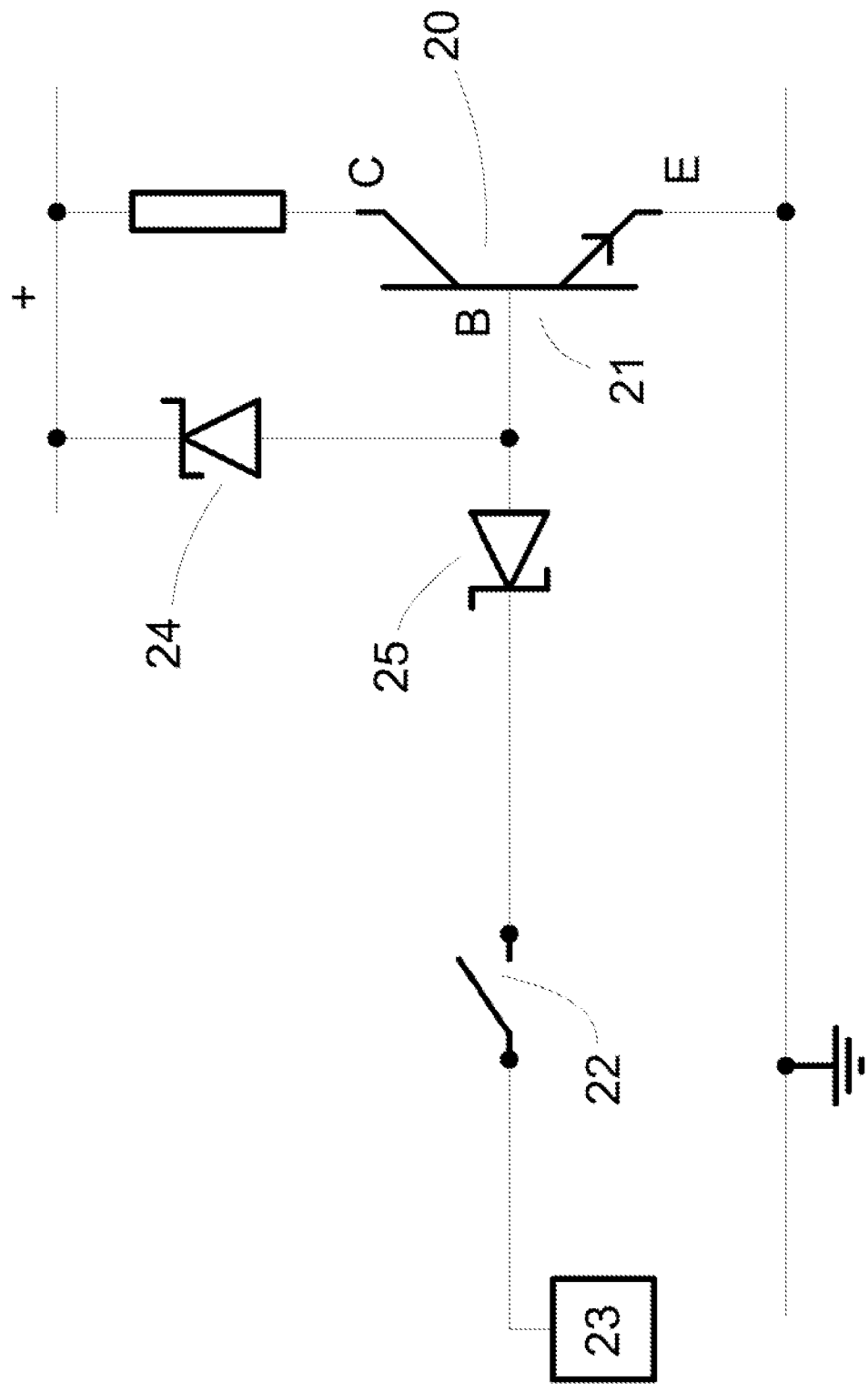
FIG. 2A is a schematic of a circuit comprised from a NPN bipolar junction transistor and a reversed biased Zener diode, which implements of the function of an inverter logic gate (NOT gate)

FIG. 2A illustrates a variant circuit 20 that implements the same function as the circuit of FIG. 1A but in which the PNP bipolar transistor is replaced with an NPN bipolar transistor. The circuit 20 operates in a similar way except that the polarities are reversed and that the current source is replaced with a current sink 23.

When switch 22 is closed the potential across the reversed biased diode 24 and transistor 21 causes a leakage current flow through the diode and thus current into the base of the transistor 21 sufficient to switch the transistor ON.

When switch 22 is closed, such that the current sink 23 is connected to the base B of the transistor 21, current through the diode is preferentially drawn through to the current sink 23 by virtue of its lower impendence compared with the impedance of the transistor 21 between the base B and emitter E terminals. As a consequence, current into the base B of the transistor 21 reduces, e.g. ceases, switching the transistor OFF.

Figure 2B:
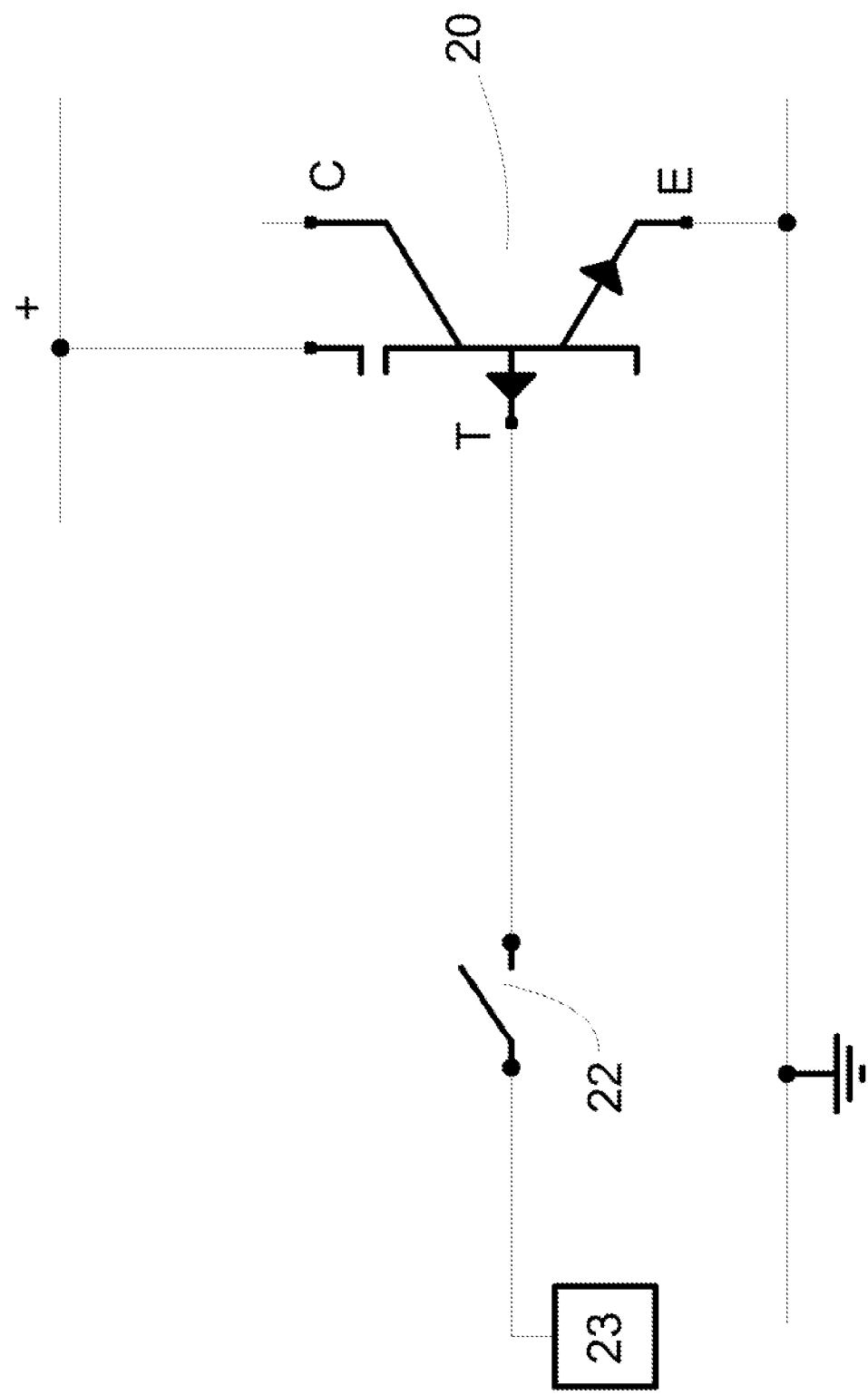
FIG. 2B is an alternative representation of the circuit of FIG. 2A using a single symbol to represent the electronic component implemented by the specific arrangement of transistors and Zener diodes.

FIG. 2B shows an alternative representation of the circuit of FIG. 2A in which the transistor 21 and diodes 24 and 25 are illustrated using a single circuit symbol.

FIGS. 1A and 1B illustrate the current source 13 and switch 12 generically to ease understanding. In most practical implementations the base of the transistor will be connected to the output of another logic circuit(s), with current ultimately derived from the high rail as opposed to an independent current source; where so, the circuit is designed so that the impedance of the circuitry from the high rail to the base terminal is lower than the impedance between the emitter and the base of the transistor. The same applies to FIGS. 2A and 2B mutandi mutadis.

Figure 3:
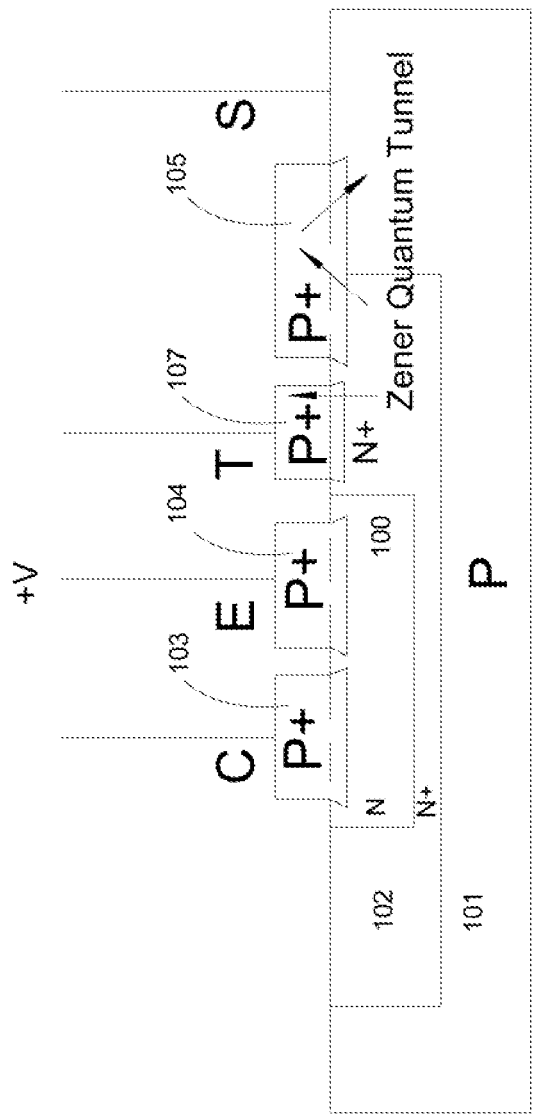
FIG. 3 is a cross section side view of a semiconductor layer structure to provide a lateral PNP bipolar transistor and Zener diodes of the arrangement illustrated in FIGS. 1A and 1B.

FIG. 3 is a schematic of a semiconductor layer structure to implement the PNP bipolar junction transistor and Zener diodes of FIGS. 1A and 1B.

A lateral bipolar junction transistor is provided from a first n-type semiconductor region 100, which provides a base region of the transistor, formed in a p-type layer 101 (e.g. substrate in which multiple regions 100 may be provided and isolated from one another by the substrate to form multiple transistor Zener diode circuit devices). A portion of the n-type region 100 is heavily doped to provide an n+ type region 102. The n+ region 102 is in contact with substrate 101. The n+ region 102 extends beneath the less heavily doped part of the n-type region 100.

A pattern of polysilicon is provided on the n-type region 100 (e.g. on the surface of the silicon wafer) to define separate p-type regions 103, 104 that provide the collector and emitter regions of the transistor. The pattern of polysilicon is also used to provide two further p+ regions 105, 107 directly on the n+ base region 102 to form diode junctions 106, 108 which provides, by virtue of the high doping levels of the n+ region 102 of base region and p+ regions 105, 107, first and second Zener diodes corresponding to Zener diodes 14, 15 of FIG. 1.

The p+ regions 103, 104, 105, 107 regions are favorably manufactured by depositing undoped and/or lightly doped polysilicon on the wafer and then doping in situ. The conditions of the doping process favorably cause portions of the n-type region 100 (and n+ region 106 in the case of p-type regions 105, 106) immediately adjacent the polysilicon to be counter-doped so that they form part of the p-type regions 103, 104 105, 107

An electrical contact S is provided on the p substrate 101 to provide the second terminal of the Zener diode.

The polysilicon layer 105 extends laterally across a PN junction within the wafer between the n+ base region 102 of the transistor and the relatively lightly doped p-type substrate 100 (though in a variant it may extend over the p-type substrate only).

Using polysilicon to create an input to the base region 102 of the transistor through a diode junction rather than using traditional metal contact removes the need to provide any metal layer. This reduces the number of steps required to manufacture the device.

The provision of a base region comprising an n region 100 that has beneath it a buried n+ type region reduces the efficiency of any parasitic vertical transistors inadvertently created as a result of the lateral transistor structure. However, providing this layer structure is complex because it is difficult to create lightly doped material in a region that is already heavily doped. Nevertheless this could be done using multiple epitaxial layers, e.g. by placing an N+ layer across the entire wafer, then a lighter N layer.

It will be appreciated that the structure of FIG. 3 can be adapted to form NPN bi-polar transistors with Zener diodes by swapping the layer types around.

The use of the first Zener diode in a reversed biased arrangement with a voltage across it that is below its Zener voltage is preferred because it provides operationally stability, especially when the Zener voltage is selected to minimize the diode thermal coefficient. Nevertheless, other diode configurations are possible. For example where the first diode is small enough and thus highly current limiting, it may be used in a normal biased arrangement. It is also possible that other type of diode be used, e.g. tunnel diodes. A tunnel diode may be used in a forward biased condition with the voltage across the diode being below the higher voltage that demarks the negative resistance region of the tunnel diode.

Figure 4:
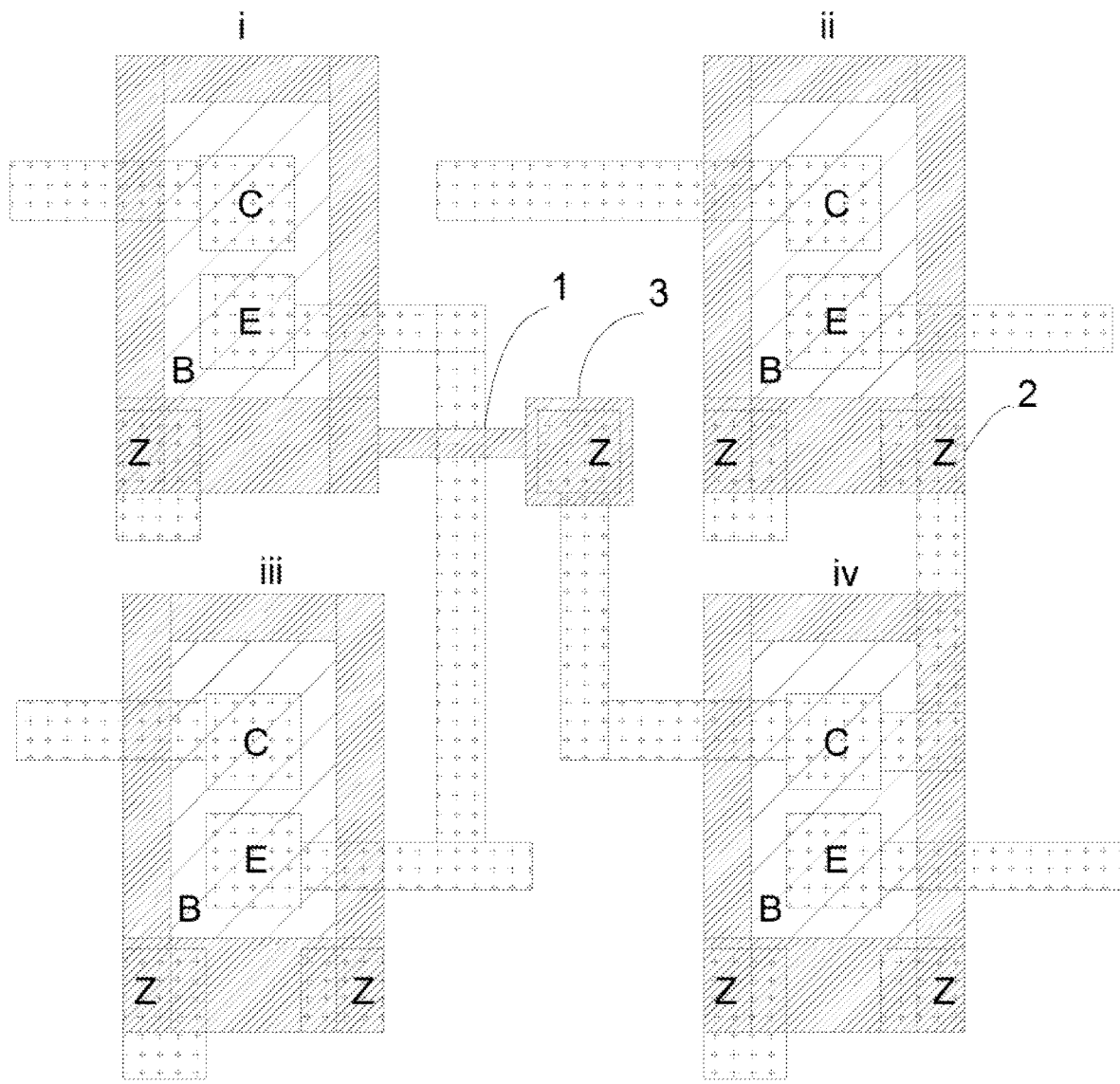
FIG. 4 is a schematic of an integrated circuit comprising multiple transistors interconnected by metal-free conductive traces.

FIG. 4 is a schematic illustrating how multiple of the transistor Zener diode devices described above can be electrically interconnected without the need for metal contacts or tracks.

The example circuit comprises four transistors labelled I, II, III and IV. The emitters of transistors I and III, which are comprised from polysilicon, are connected together via a conductive trace of polysilicon which cross over the n+ regions (indicated at 1 on FIG. 4). Interference between the polysilicon trace and the n+ regions is prevented by an oxide layer lying over the n+ region.

The base of transistor II is connected through diode 2 to the collector of transistor IV via a polysilicon trace.

The base of transistor I is connected via diode Z (3) to the collector of transistor IV. To achieve this, the N+ region of transistor I comprises an elongate 'arm' that extends away from the emitter and collector of transistor I such that the diode (3) of transistor I is remote from the emitter and collector of transistor I. The arm of n+ provides an area through which the polysilicon trace connecting transistors I and III can cross. To complete the connection between transistors I and IV a trace of polysilicon extends between the collector of transistor IV and the diode 3.

Figure 5:
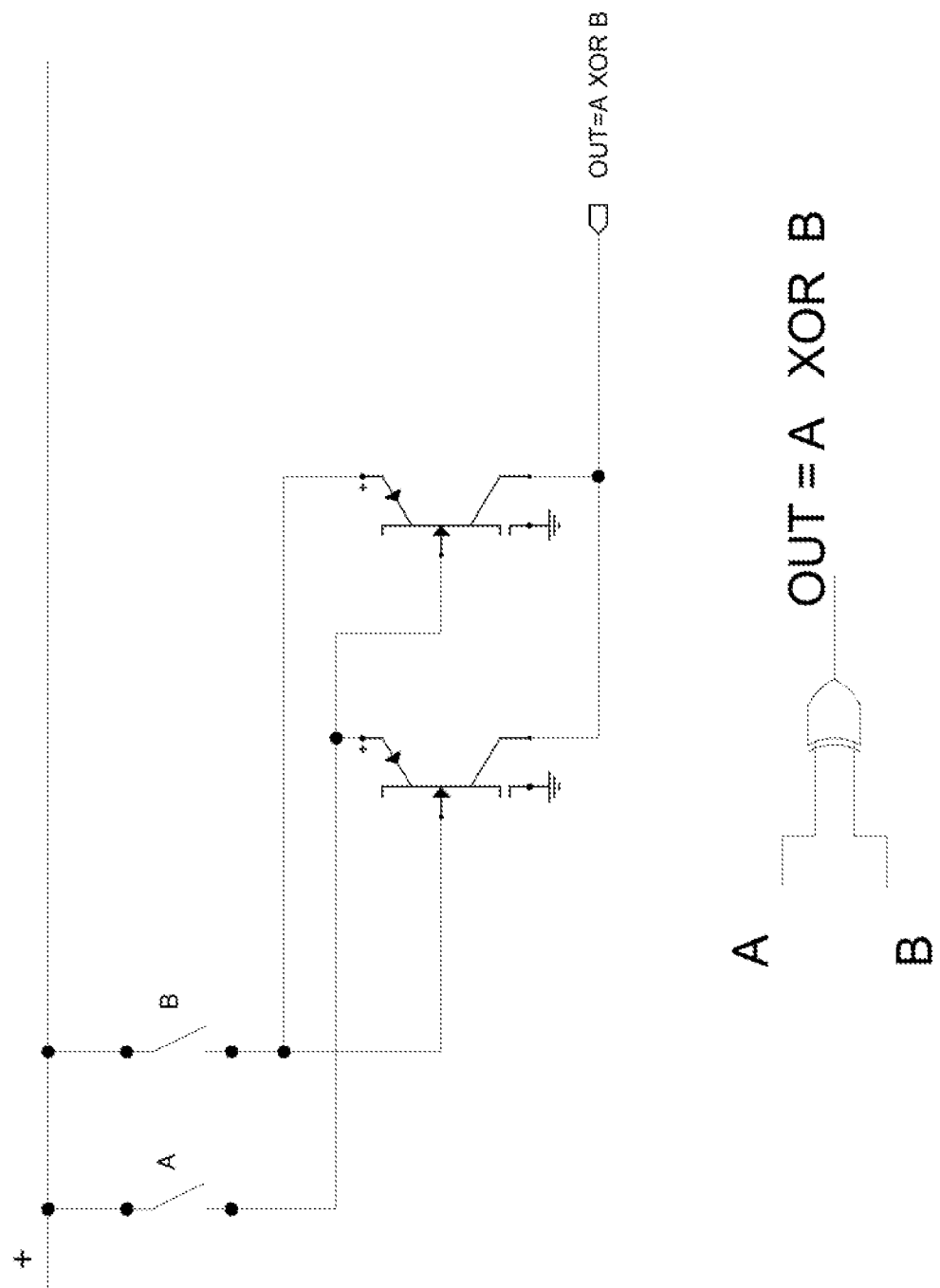
FIG. 5 is a schematic of a circuit implementing an XOR logic gate using multiple of the circuits of FIG. 1.
Figure 6:
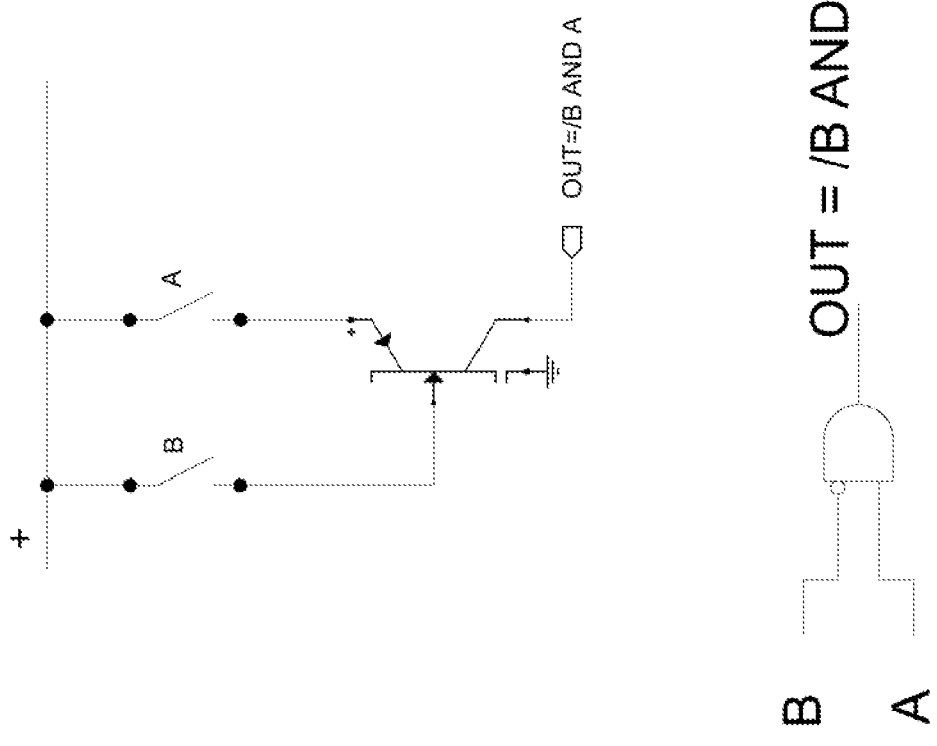
FIG. 6 is a schematic of a circuit implementing an A AND Not B logic gate using the circuits of FIG. 1.

The circuit described in relation to FIGS. 1-3 can be combined to implement logic gates. FIGS. 5 and 6 illustrate example circuits to implement a XOR gate and an A AND NOT B gate respectively. In each figure the transistor diode device is represented using the circuit symbol introduced in FIG. 1B. Both of these examples illustrate how the circuit of FIGS. 1-3 can be used to implement logic gates with a lower number of transistors than would usually be required if implemented using other fabrication methods, e.g. CMOS.

Figure 7A:
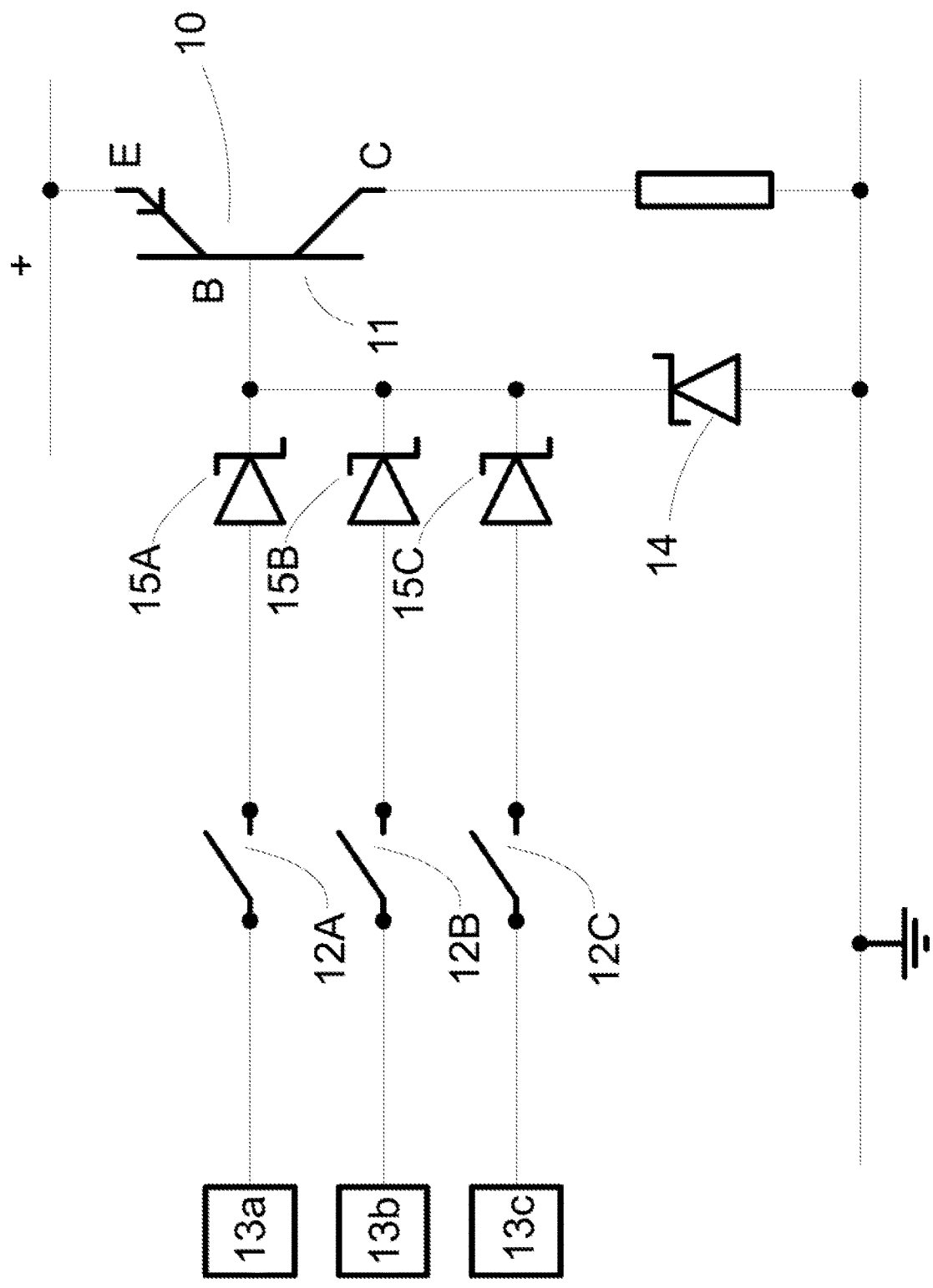
FIG. 7A is a schematic of a circuit comprising a PNP bipolar junction transistor and diodes, which implements a NOR logic gate.
Figure 7B:
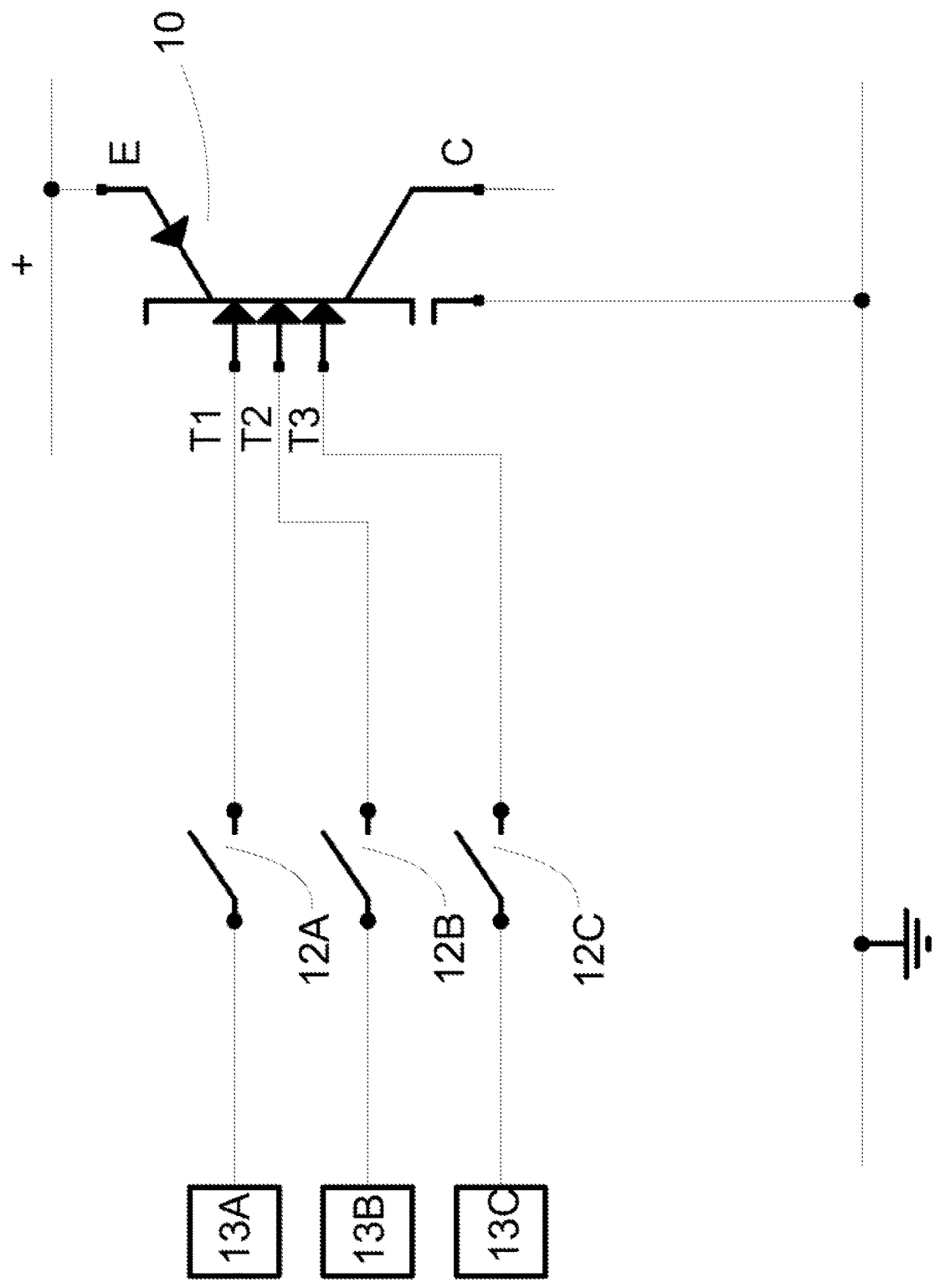
FIG. 7B is an alternative representation of the circuit of FIG. 7A using a single symbol to represent the electronic component implemented by the specific arrangement of transistors and Zener diodes.

FIGS. 7A and 7B illustrate a variant circuit which is identical to FIG. 1 except that it includes three signal sources 13A, 13B, 13C, each independently switchably connectable to the base of the normally ON transistor 10 through a different switch 12A, 12B, 12C.

When one of switches 12A, 12B, 13C is closed, the associated current source 13A, 13B, 13C, is connected to the base B of the transistor 11 through one of forward biased Zener diodes 15A, 15B, 15C.

Each of the diodes 15A 15B 15C operate in the same way as diode 15 of FIG. 1.

Each is selected to have a forward voltage (i.e. through high doping of the junction) that is lower than the voltage drop across the emitter base of transistor 11 when the transistor is in the OFF state. As a result connection of any one of the current sources 13A 13B or 13C to the base of transistor 11 causes the transistor to switch to an OFF state.

FIG. 7B illustrates the circuit of FIG. 7A using the circuit symbol introduced in FIG. 1B. The three connections between the three current sources to the base are labelled T1, T2 and T3, respectively.

Figure 8A:
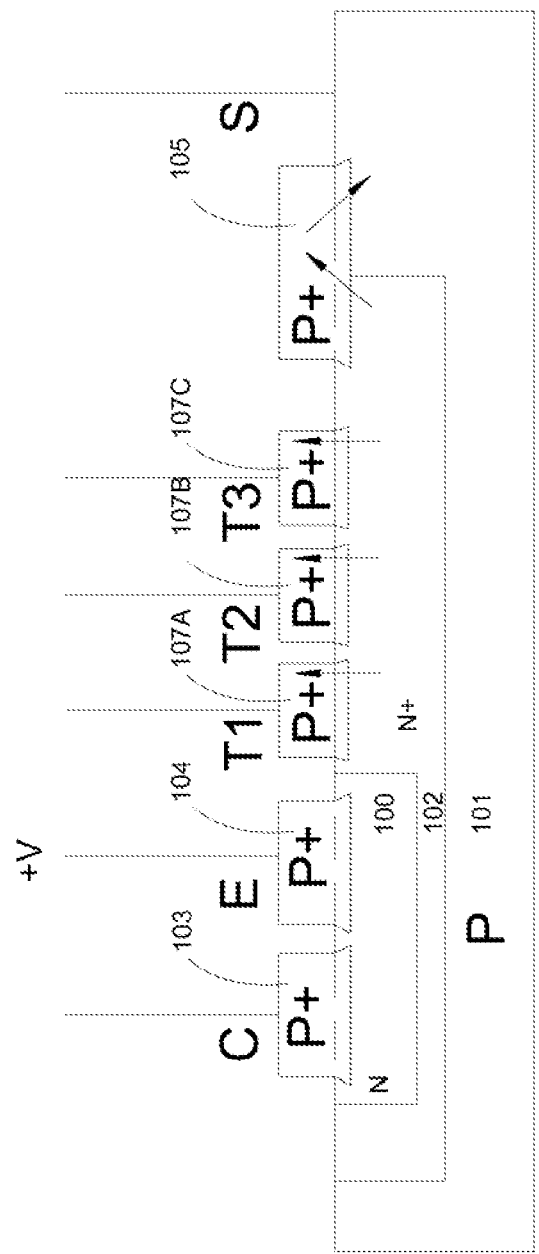
FIG. 8A is a cross section side view of a semiconductor layer structure to provide a variant lateral PNP bipolar transistor and Zener diodes of the arrangement illustrated in FIGS. 7A and 7B.
Figure 8B:
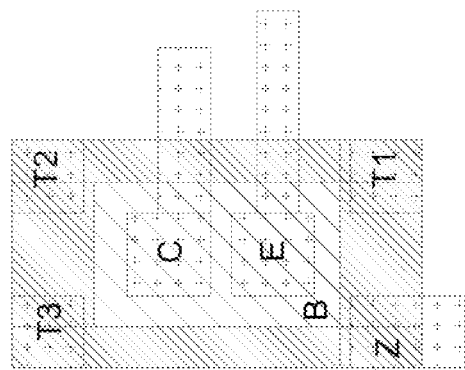
FIG. 8B is a plan view schematic of the semiconductor layer structure of FIG. 8A.

FIGS. 8A and 8B illustrate an example semiconductor layer structure to implement the transistors and diodes of the circuit of FIGS. 7A 7B. The structure is identical to that of FIG. 3 excepted that the pattern of polysilicon is used to provide two additional p+ regions, three in total, 107A, 107B, 107C, directly on the n+ base region 102 to form three diode junctions 108A, 108B, 108C, providing three second Zener diodes that correspond to Zener diodes 15A, 15B 15C of FIG. 6A. FIG. 8B is a schematic plan view showing an example pattern of poly-silicon on the n+ base region 102 to provide and isolate each of the p+ regions 103, 104 105, 107A, 107B, 107C from one another.

Although the examples illustrated in FIGS. 7 and 8 show three input connections to the base 11 of transistor 10 for connection of three separate current sources 13A, 13B, 13C, it will be appreciated that there may be a different number of connections e.g. two, four or more for connecting to a different number of current sources.

Figure 9:
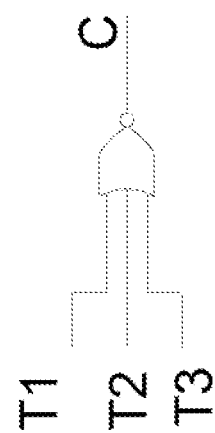
FIG. 9 is a representation of the logic circuit implemented by the circuits of FIGS. 7A-8B.

The layer structure of FIGS. 8A and 8B can be used to implement the NOR logic gate shown in FIG. 9, as the transistor 10 will be OFF in the instance that any one of the current sources 13A, 13B, 13C, is connected to the base 11. Advantageously this implementation requires only one transistor compared with prior art circuits, such as those manufacture using CMOS fabrication which require at least two transistors.

Figure 10:
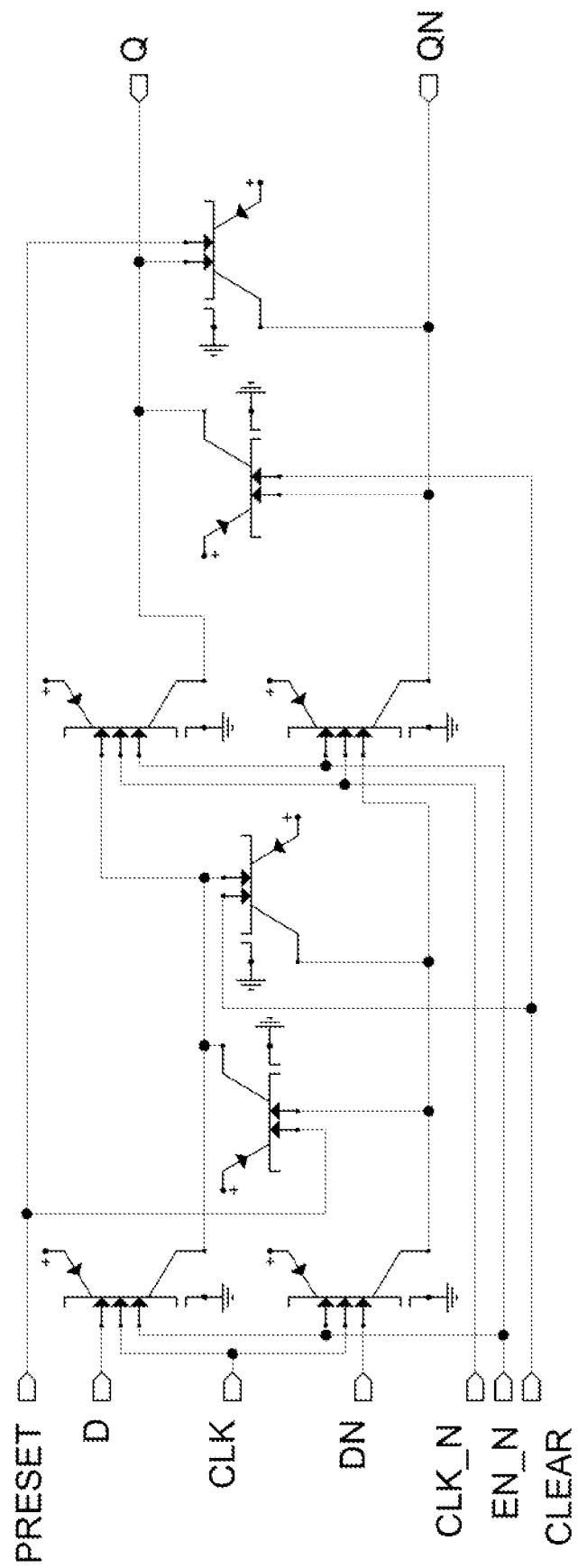
FIG. 10 is a circuit implementing a D type flip flop using the circuit of FIG. 7.
Figure 11:
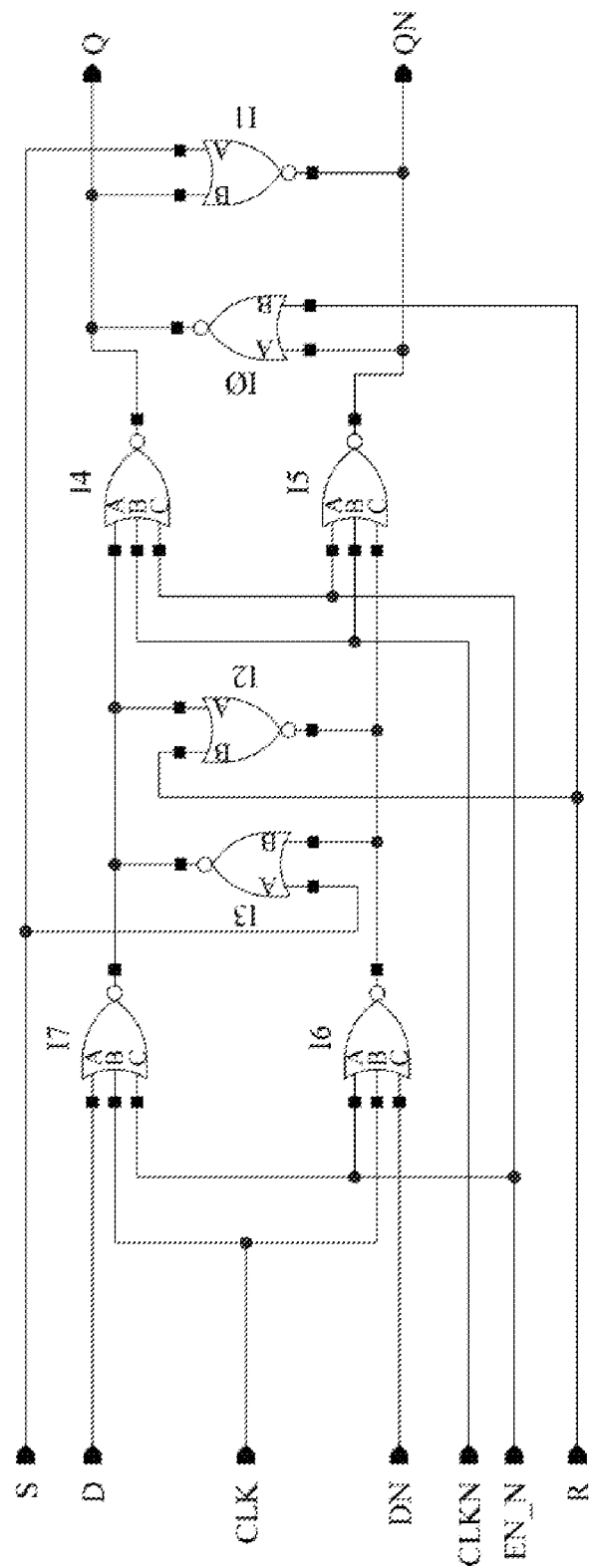
FIG. 11 is the circuit of FIG. 10 represented using logic gate symbols.

FIG. 10 illustrates example circuitry that incorporates multiples of the transistor circuit of FIG. 7 to implement a D type master-slave flip-flop. FIG. 11 shows the same circuit illustrated in FIG. 10 showing the NOR logic gate function provided by each of the transistor circuits.

Figure 12:
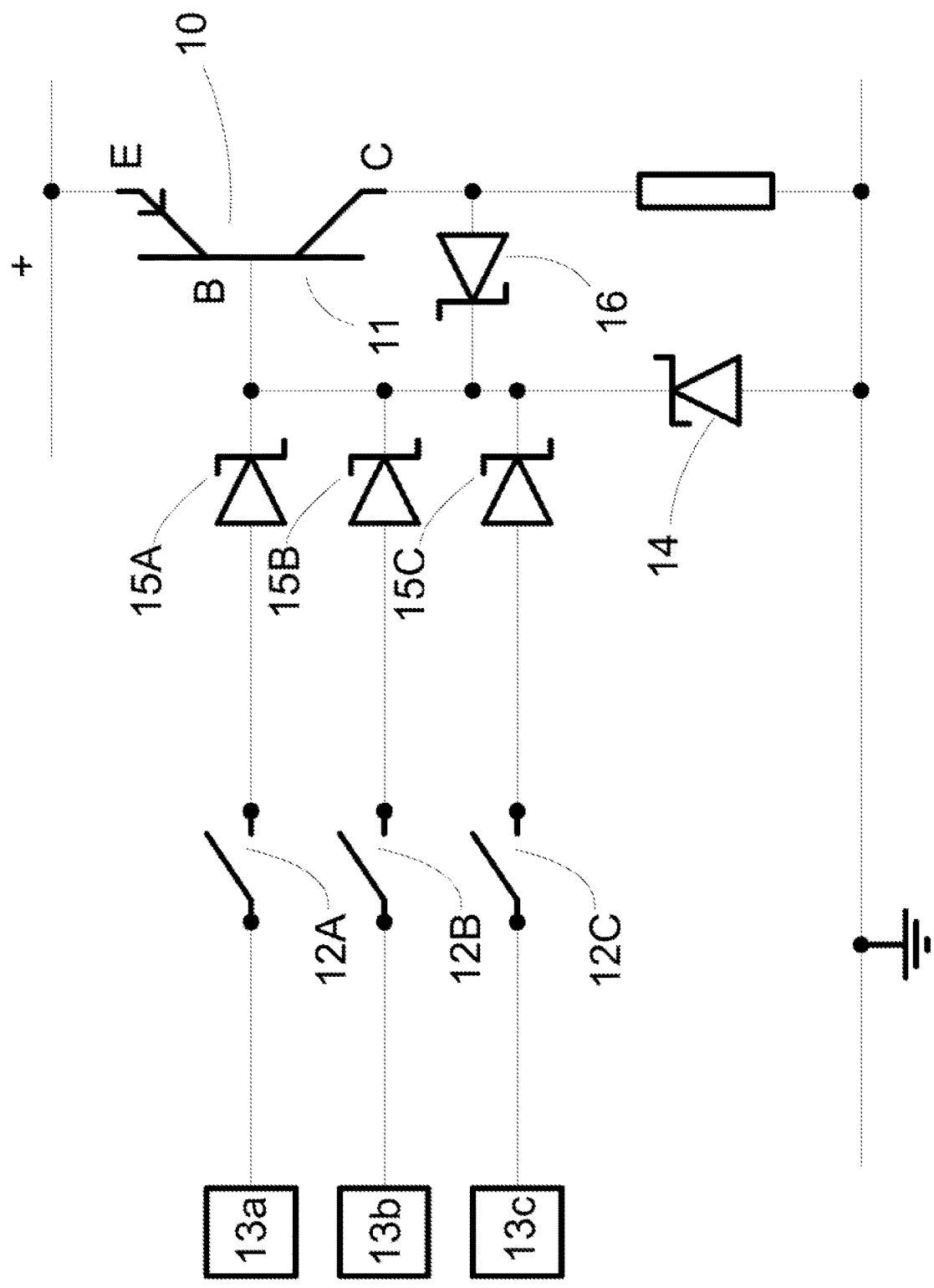
FIG. 12 is a schematic of a circuit, which implements a NOR gate, comprising a PNP bipolar junction transistor, a reversed biased Zener diode, and a Baker clamp diode.

FIG. 12 illustrates a variant circuit of FIG. 7. As with the embodiment of FIG. 7 the number of inputs 13 may vary.

The circuit of FIG. 12 is substantially the same as that of FIG. 7 but with the addition of a further diode 16 that functions as a Baker clamp and thus hereafter referred to as the Baker clamp diode 16.

The Baker clamp diode 16 is connected between the base and collector of the transistor 11, oriented with its anode facing the collector. Through the Baker clamp diode 16, the collector and base of the transistor 11 are connected such that as the voltage at the collector rises when the transistor is ON, the voltage at the base will rise towards the voltage of the collector minus the voltage drop across the Baker clamp diode 16. In this way the magnitude of the voltage swing at the base 11 of the transistor 10 between the ON and OFF states is reduced thereby allowing for faster switching.

Through selecting the voltage drop provided across Zener diodes 15A, 15B, 15C and also across the Baker clamp 16, the values of upper and lower voltages at the base of the transistor 11 during switching can be selected.

Favorably the values of the upper and lower voltages are selected, based on the characteristics of the transistor 11, so that during operation of the circuit:

there is always current flow between the emitter and collector;

the base is never saturated and in the transistor OFF state the current flow between the emitter and collector is sufficiently small that the voltage at the collector is too low to switch off a transistor in the next stage of the logic circuit.

Such an arrangement allows for further improvement in the transistor's 11 switching speed.

Figure 13:
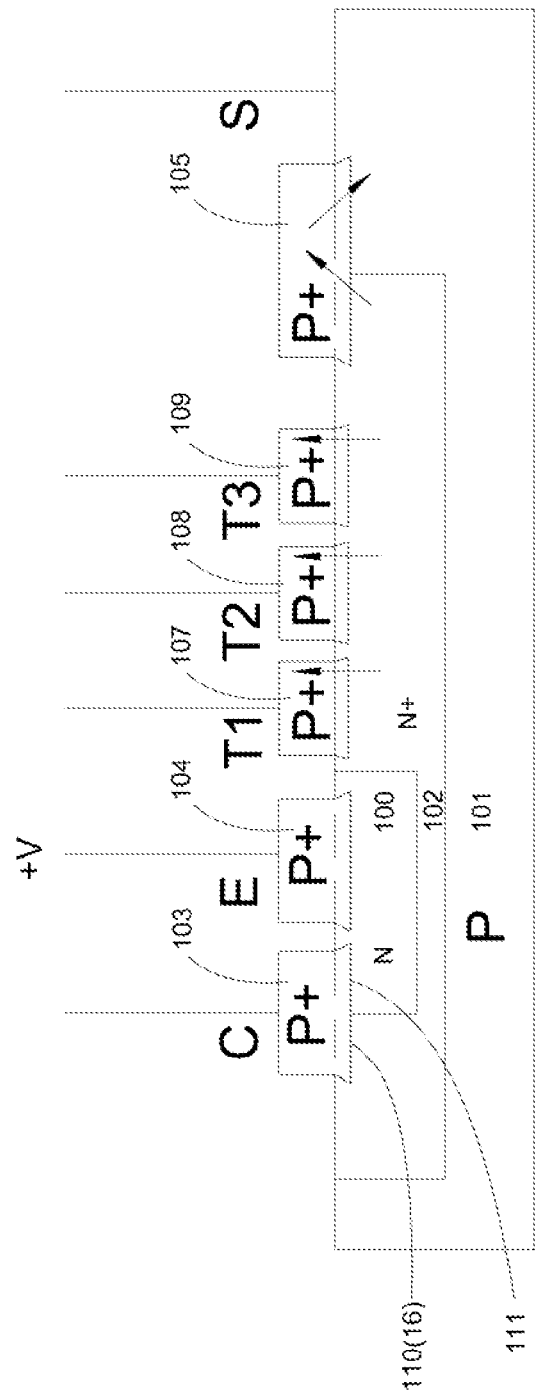
FIG. 13 is a cross section side view of a semiconductor layer structure used to implement the circuit of FIG. 12.

FIG. 13 is a schematic of a semiconductor layer structure to implement the transistor 11, diodes 15A, 15B, 15C, and Baker clamp diode 16.

The structure is substantially the same as that of FIG. 8A with the exception that the p+ region 103 of the collector is positioned to traverse, and thus be in direct contact with both, the n-type region 100 and the n+ region 102. This arrangement provides two diode junctions; a first 111 between p+ region 103 and the region 100 of the transistor 11, and a second 110 between the p+ region 103 and the n+ region 102 that provides the Baker clamp diode 16.

The area of the overlap between the p+ region 103 and the n+ region 102 determines the size of the Baker clamp diode 16 and thus the voltage drop across it.

Figure 14:
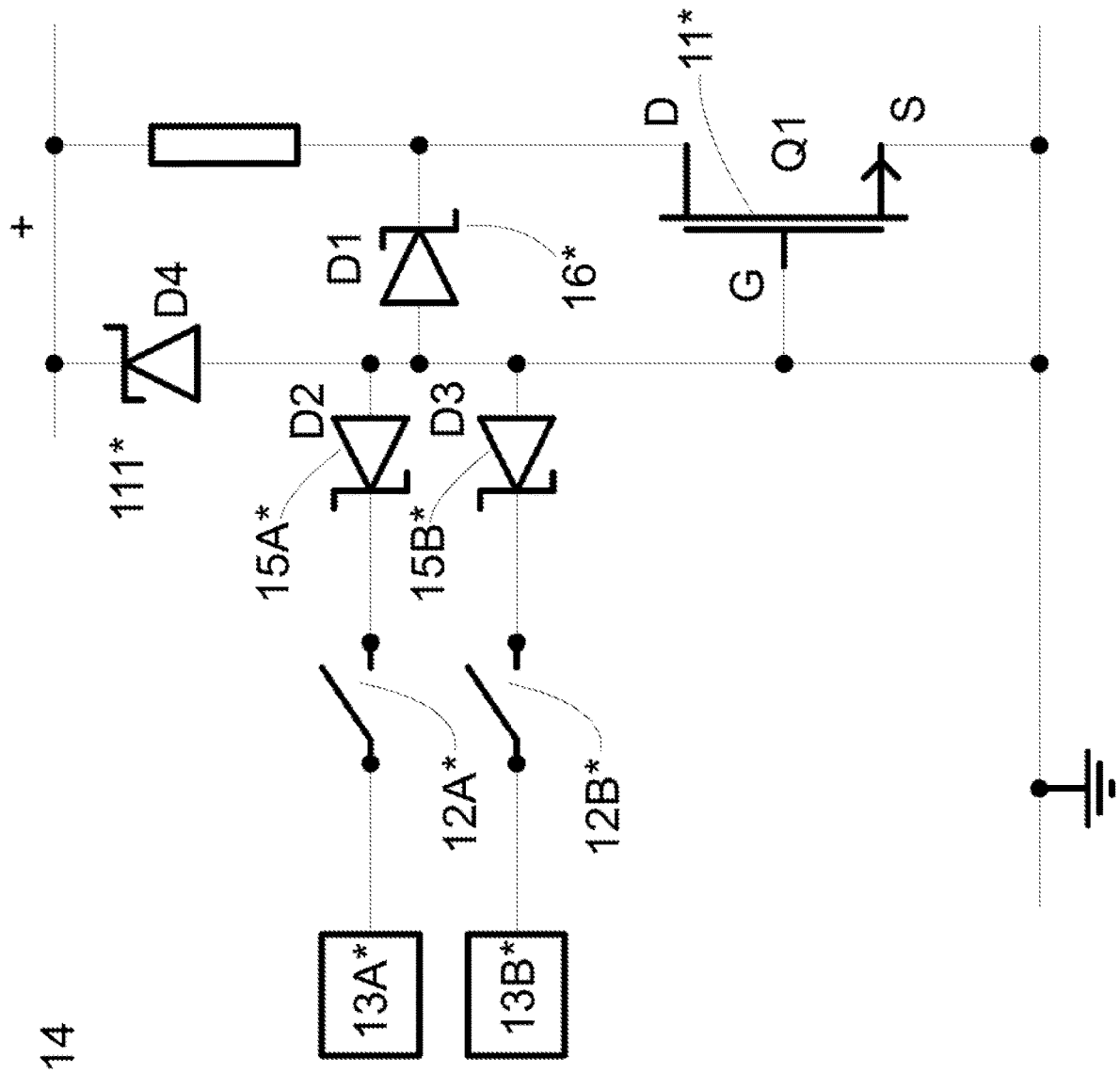
FIG. 14 is a schematic of a circuit which implements a NOR gate, i.e. equivalent to the circuit of FIG. 12 implemented using IGZO with a NMOS transistor.

FIG. 14 is a schematic of an equivalent circuit to that of FIG. 12 (but with two inputs rather than three) implemented as an integrated circuit including an NMOS transistor, which can be produced with Indium Gallium Zinc Oxide (IGZO) semiconductor material.

Components of the circuit that provide the equivalent function to that of FIG. 12 have been assigned the same numeral with the addition of an asterisk (*).

The transistor 11* is a NMOS transistor having source, drain and gate terminals.

The equivalent function of the Zener diode 14 of FIG. 12 is implemented by a reversed biased leaky Schottky diode 14* (or depletion mode NMOS transistor configured to act as a resistor), arranged between a positive reference voltage and the gate of the transistor 11*. When the signal inputs 13a*, 13b*, are disconnected from the gate of the transistor 11* the leaky Schottky diode 14* ensures there is sufficient positive voltage at the gate that the transistor is ON.

When either one of the signal inputs 13a*, 13b*, is connected to a reference voltage, the voltage at the gate drops and the transistor 11* switches OFF.

The equivalent function of the Baker clamp 16 is provided by a Schottky diode 16* connected between the drain and gate of the transistor 11*.

When the transistor is ON, the voltage at the drain is pulled towards ground. The voltage at the drain will continue to drop until the Schottky diode 16* switches to a forward biased configuration whereupon any further increase in voltage between the gate and source (Vgs) of the transistor 11 is inhibited.

Diodes 15A* and diodes 15B* provide the equivalent function of diodes 15A and diodes 15B, limiting the lower voltage limit at the gate.

The diodes 15A*, diodes 15B* and 16* thus restrict the voltage swing at the base of the transistor 11* allowing for substantial increase in switching speed.

Figure 15:
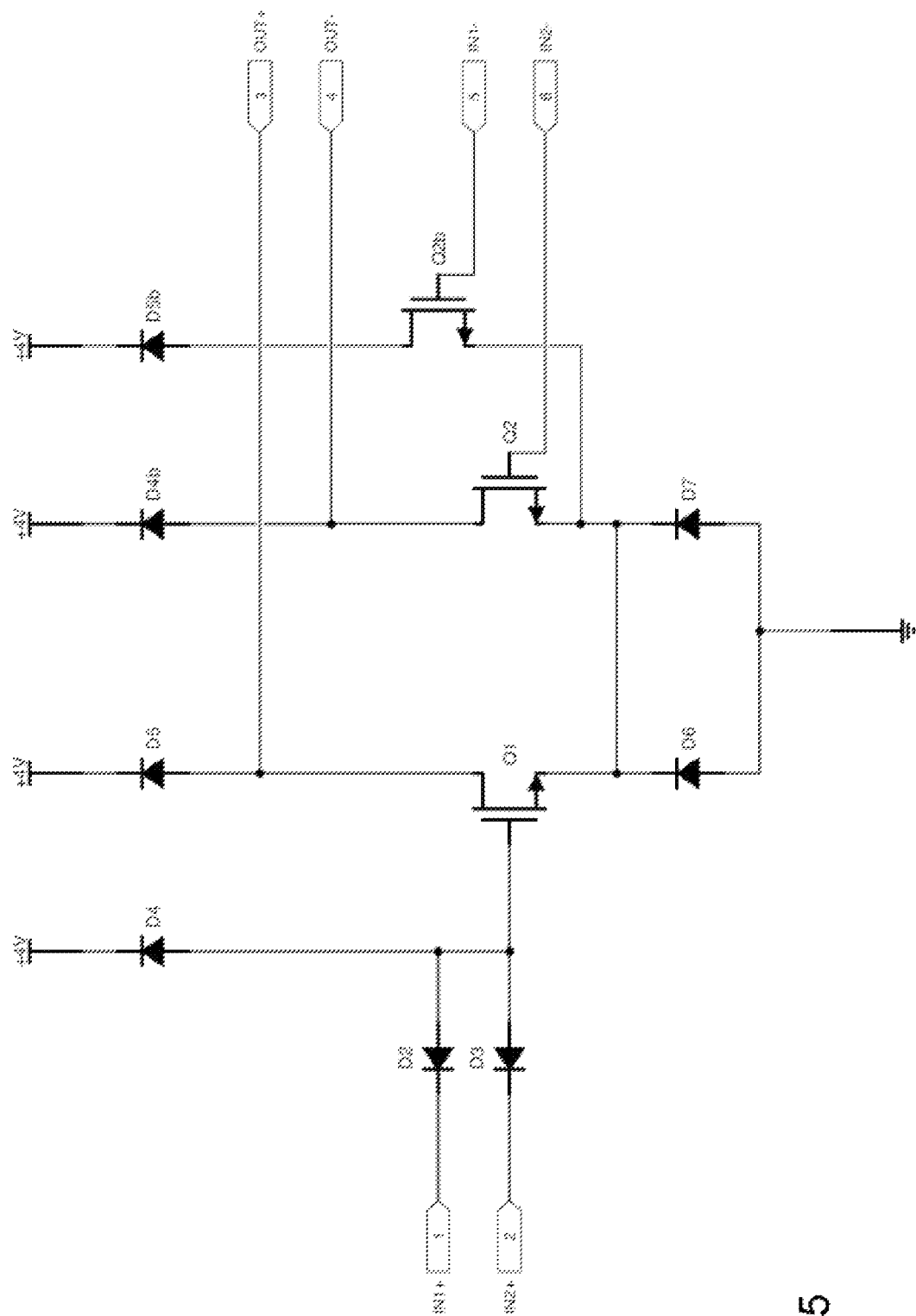
FIG. 15 is a schematic of a variant circuit of FIG. 14.

FIG. 15 is a schematic of a differential version of the circuit to FIG. 14 to provide higher noise immunity.

The Abstract is provided with the understanding that it is not intended be used to interpret or limit the scope or meaning of the claims. In addition, in the foregoing Detailed Description, various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The corresponding structures, materials, acts, and equivalents of all means or step plus function elements in the claims below are intended to include any structure, material, or act for performing the function in combination with other claimed elements as specifically claimed. The description herein has been presented for purposes of illustration and description, but is not intended to be exhaustive or limited to the examples in the form disclosed. Many modifications and variations will be apparent to those of ordinary skill in the art without departing from the scope of the examples presented or claimed. The disclosed embodiments were chosen and described in order to explain the principles of the embodiments and the practical application, and to enable others of ordinary skill in the art to understand the various embodiments with various modifications as are suited to the particular use contemplated. It is intended that the appended claims below cover any and all such applications, modifications, and variations within the scope of the embodiments.

Although specific embodiments of the subject matter have been disclosed, those having ordinary skill in the art will understand that changes can be made to the specific embodiments without departing from the scope of the disclosed subject matter. The scope of the disclosure is not to be restricted, therefore, to the specific embodiments, and it is intended that the appended claims cover any and all such applications, modifications, and embodiments within the scope of the present disclosure.

The illustrations of embodiments described herein are intended to provide a general understanding of the structure and operation of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized.

Accordingly, the specification and drawings are to be regarded in an illustrative rather than a restrictive sense. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of ordinary skill in the art upon reviewing the above description. Therefore, it is intended that the disclosure not be limited to the particular embodiment(s) disclosed as the best mode contemplated for carrying out this invention, but that the invention will include all embodiments falling within the scope of the appended claims.

What is claimed is:

1. A circuit comprising:
   a transistor;
   a signal source;
   a base of the transistor being switchably connectable to the signal source;
   a first diode connected between the base of the transistor, and a reference voltage;
   wherein the circuit is arranged such that when the signal source is not connected to the base of the transistor, a voltage applied at an emitter of the transistor causes a current flow through the base of the transistor and through the first diode such that the transistor is in an ON state;
   the impedance of the signal source is lower than the impedance of the transistor through the emitter and base;
   the first diode provides a current limiting function such that when the signal source is connected to the base of the transistor, current flow through the base reduces such that the transistor switches to an OFF state; and in which
      the circuit comprises a second diode, the second diode comprised from a semiconductor region that provides the base of the transistor and a further semiconductor region in direct contact with the semiconductor region that provides the base of the transistor; and in which the signal source is connectable to the base of the transistor through the second diode.

2. The circuit according to claim 1 wherein the first diode is arranged in the circuit to be reversed biased when the voltage is applied to the emitter terminal of the transistor.

3. The circuit according to claim 1 wherein doping levels of semiconductor regions used to provide the first diode, the second diode, or both, are sufficiently high that current flow through the first diode, the second diode, or both, is attributable, at least in part, to a quantum tunneling effect.

4. The circuit according to claim 1, wherein the first diode has a temperature coefficient in the range −2 mV to 2 mV per degree Centigrade inclusive.

5. The circuit according to claim 1 wherein the first diode is a Zener diode.

6. The circuit according to claim 5 wherein the first diode has a Zener voltage between 4 and 5.6 Volts inclusive.

7. The circuit according to claim 6 wherein the first diode has a Zener voltage of about 5.6 volts.

8. The circuit according to claim 1 wherein the second diode is a Zener diode.

9. The circuit according to claim 1 wherein, when the circuit is in operation, the voltage drop across the second diode is smaller than the voltage drop across the base and emitter of the transistor.

10. The circuit according to claim 1 comprising a third diode arranged between a collector of the transistor and the base of the transistor arranged to provide a function of a Baker clamp.

11. An inverter logic gate circuit comprising the circuit of claim 1.

12. The circuit according to claim 1 comprising one or more further diodes, each of the one or more further diodes comprised from the semiconductor region that provides the base of the transistor and one or more further semiconductor regions in direct contact with the semiconductor region that provides the base of the transistor; and in which one or more further signal sources are connectable to the base of the transistor through the one or more further diodes.

13. An NOR logic gate circuit comprising the circuit of claim 12.

14. A method of operating a circuit, wherein the circuit comprises a bipolar transistor, a diode having a first terminal connected to a base terminal of the bipolar transistor; and a second terminal of the diode connected to a reference voltage, and wherein a voltage is applied across an emitter of the bipolar transistor and the second terminal of the diode, the method comprising:
   switchably connecting the base terminal of the bipolar transistor and the first terminal of the diode to a signal source having an impedance lower than the impendence across an emitter and base terminals of the bipolar transistor such that:
      when not connected causing a current flow through the base terminal of the bipolar transistor and through the diode to turn the transistor ON; or
      when connected, current flow through the base of the bipolar transistor reduces to switch the transistor OFF.

15. The method according to claim 14 wherein the voltage is applied across the emitter terminal of the bipolar transistor and the second terminal of the diode such that the diode is reversed biased.

16. The method according to claim 14 wherein the diode is a Zener diode and the voltage applied across the diode when the transistor is ON is less than a breakdown voltage of the Zener diode.

17. An integrated circuit comprising:
   an NMOS transistor;
   a gate of the transistor being switchably connectable to a signal source;
   a first diode connected between the gate of the transistor, and a reference voltage;
   the integrated circuit arranged such that when the signal source is not connected to the gate of the transistor the transistor is in an ON state;
   a resistor device connected between the signal source and the gate of the transistor; and
   a second diode connected between the gate and the drain of the transistor; the second diode selected to limit a difference between a voltage at the gate and source of the transistor when the transistor is in the ON state.

18. The integrated circuit according to claim 17 wherein the first diode comprises a leaky Schottky diode.

19. The integrated circuit according to claim 17 wherein the first diode is provided by a depletion mode NMOS transistor.

20. The integrated circuit according to claim 17, wherein the NMOS transistor comprises Indium gallium oxide (IGZO) semiconductor material.

* * * * *